United States Patent
Chinnakkonda Vidyapoornachary et al.

(10) Patent No.: US 10,528,288 B2
(45) Date of Patent: Jan. 7, 2020

(54) THREE-DIMENSIONAL STACKED MEMORY ACCESS OPTIMIZATION

(71) Applicant: International Business Machines Corporation, Armonk, NY (US)

(72) Inventors: Diyanesh B. Chinnakkonda Vidyapoornachary, Bangalore (IN); John B. DeForge, Barre, VT (US); Warren E. Maule, Cedar Park, TX (US); Kirk D. Peterson, Jericho, VT (US); Sridhar H. Rangarajan, Bangalore (IN); Saravanan Sethuraman, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 75 days.

(21) Appl. No.: 15/847,957

(22) Filed: Dec. 20, 2017

(65) Prior Publication Data

US 2019/0187930 A1 Jun. 20, 2019

(51) Int. Cl.
*G06F 3/06* (2006.01)
*G06F 13/16* (2006.01)
(Continued)

(52) U.S. Cl.
CPC .......... *G06F 3/0659* (2013.01); *G06F 3/0604* (2013.01); *G06F 3/0634* (2013.01);
(Continued)

(58) Field of Classification Search
CPC .... G06F 3/0659; G06F 3/0604; G06F 3/0685; G06F 11/1068; G06F 13/1668;
(Continued)

(56) References Cited

U.S. PATENT DOCUMENTS

| 8,347,254 B2 | 1/2013 | Norman |
| 9,195,577 B2 | 11/2015 | Saraswat et al. |
| 9,378,104 B2 | 6/2016 | Chinnakkonda Vidyapoornachary et al. |
| 9,490,003 B2 | 11/2016 | Shoemaker |

(Continued)

OTHER PUBLICATIONS

Akhter et al., "Design for stackability of flash memory devices based on thermal optimization", 24th Digital Avionics Systems Conference, vol. 2, 2005, 14 pages.

(Continued)

*Primary Examiner* — Thien Nguyen
(74) *Attorney, Agent, or Firm* — Cantor Colburn LLP; Bryan Bortnick

(57) ABSTRACT

An aspect includes receiving a request to access one or more memory devices in a stack of memory devices in a memory. Each of the memory devices are communicatively coupled to at least one other of the memory devices in the stack via a through silicon via (TSV). A current operating mode of the memory is determined in response to receiving the request. Based at least in part on the current operating mode of the memory being a first mode, a chip select switch is activated to provide access to exactly one of the memory devices in the stack of memory devices. Based at least in part on the current operating mode of the memory being a second mode, the chip select switch is activated to access all of the memory devices in the stack in parallel. The request is serviced using the activated chip select switch.

17 Claims, 6 Drawing Sheets

(51) Int. Cl.
*G06F 11/10* (2006.01)
*G11C 29/52* (2006.01)
*G11C 5/02* (2006.01)
*G11C 11/409* (2006.01)
*G11C 5/06* (2006.01)
*G11C 5/04* (2006.01)
*G11C 7/10* (2006.01)
*G11C 8/12* (2006.01)

(52) U.S. Cl.
CPC ........ *G06F 3/0685* (2013.01); *G06F 11/1048* (2013.01); *G06F 11/1068* (2013.01); *G06F 13/1668* (2013.01); *G11C 5/02* (2013.01); *G11C 5/04* (2013.01); *G11C 5/06* (2013.01); *G11C 5/063* (2013.01); *G11C 7/1045* (2013.01); *G11C 8/12* (2013.01); *G11C 11/409* (2013.01); *G11C 29/52* (2013.01)

(58) Field of Classification Search
CPC ....... G06F 3/0634; G11C 5/06; G11C 11/409; G11C 5/02; G11C 29/52
See application file for complete search history.

(56) References Cited

U.S. PATENT DOCUMENTS

| | | | |
|---|---|---|---|
| 2008/0091979 A1* | 4/2008 | Okuda | G11C 29/42 714/42 |
| 2009/0305463 A1 | 12/2009 | Bartley et al. | |
| 2013/0173971 A1* | 7/2013 | Zimmerman | G11C 29/32 714/718 |
| 2015/0063045 A1* | 3/2015 | Hickey | G11C 29/26 365/201 |
| 2016/0293268 A1 | 10/2016 | Jan et al. | |

OTHER PUBLICATIONS

Sun et al., "A novel architecture of the 3D stacked MRAM L2 cache for CMPs", 2009 IEEE 15th International Symposium on High Performance Computer Architecture, 2009, 11 pages.

Zhang et al., "Exploring Phase Change Memory and 3D Die-Stacking for Power/Thermal Friendly, Fast and Durable Memory Architectures", 2009 18th International Conference on Parallel Architectures and Compilation Techniques, 2009, 12 pages.

* cited by examiner ively stacked in the memory 208. Each of the memory devices 206 is communicatively coupled to at least one other of the memory devices in the stack via a through silicon via (TSV).
THREE-DIMENSIONAL STACKED MEMORY ACCESS OPTIMIZATION

BACKGROUND

Embodiments of the invention relate to computer memory, and more specifically to three-dimensional (3D) stacked memory access optimization.

High speed server systems with large memory capacities are becoming increasingly important in order to support ever growing customer demands. Modern portable devices require high capacity memory with low latency and a compact form factor. 3D memory stacking solutions can be utilized to provide higher capacity memory within a smaller footprint. The stacking of multiple memory integrated circuits (ICs) (also referred to herein as "chips") also provides an improvement in electrical performance due to shorter interconnects. One technique that is used to stack chips is through-silicon via (TSV) where vertical copper channels are built into each chip so that when they are placed on top of each other, the TSVs connect the chips together. TSVs allow for stacking of volatile dynamic random access memory (DRAM) with a processor to build very compact devices for portable applications. TSV techniques also allow 3D stacking of memory chips to create dense non-volatile memory such as flash or solid state drives with high capacity.

SUMMARY

Embodiments of the invention include methods, systems, and computer program products for three-dimensional (3D) stacked memory access optimization. An example method includes receiving a request to access one or more memory devices in a stack of memory devices in a memory. Each of the memory devices are communicatively coupled to at least one other of the memory devices in the stack via a through silicon via (TSV). A current operating mode of the memory is determined in response to receiving the request. Based at least in part on the current operating mode of the memory being a first mode, a chip select switch is activated to provide access to exactly one of the memory devices in the stack of memory devices. Based at least in part on the current operating mode of the memory being a second mode, the chip select switch is activated to access all of the memory devices in the stack in parallel. The request is serviced using the activated chip select switch.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
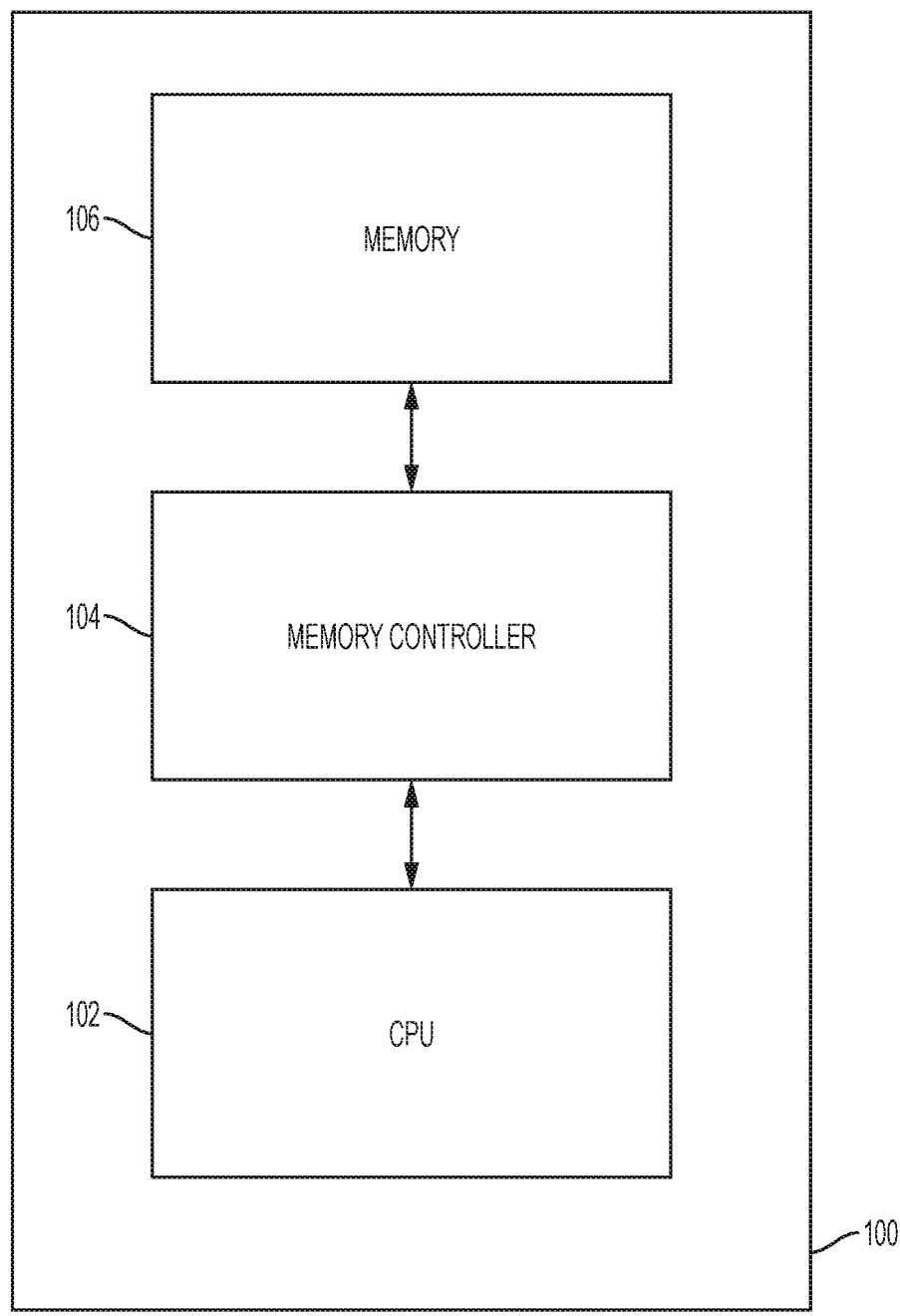
FIG. 1 depicts a block diagram of a system for storing and retrieving data in a memory in accordance with one or more embodiments of the invention.

One or more embodiments of the invention described herein provide the ability to dynamically select between modes when accessing memory devices in a three-dimensional (3D) stacked memory. In a first mode, a memory device is accessed in a horizontal manner by specifying a particular memory device in a stack of memory devices on a memory module. In a second mode, the memory devices are accessed in a vertical manner by specifying all of the memory devices in the stack of memory devices. In accordance with one or more embodiments of the invention, the memory devices in a stack are the same type of memory devices, or homogeneous. In accordance with one or more other embodiments of the invention, the memory devices in a stack are heterogeneous and include two or more different types of memory devices such as, but not limited to: dynamic random-access memory (DRAM) devices, flash memory devices, spin-transfer torque magnetic random access memory (STT-MRAM) devices, and static random-access memory (SRAM) devices. In the first mode, memory devices that are located on the same level in different stacks of memory devices on a memory module can be accessed together as a rank using, for example, a single chip select signal that is shared by the memory devices at the same level in the stacks. In the second mode, the memory devices that are located in the same memory device stack are accessed together as a rank using, for example, a single chip select signal that is used to access all of the memory devices in the stack.

In accordance with one or more embodiments of the invention, different types of memory devices can be combined in a single stack of memory devices in a memory to improve latency, power, and thermal characteristics of the memory. Memory devices can be placed in the stack to optimize thermal dissipation in the stack with the memory device types with the hottest temperatures being placed on the top and the bottom of the stack. Access time can be improved by allowing all of the memory devices in a stack to be accessed as a rank by a single select signal. When the memory devices in a stack have different speeds, a multiplexed frame can be generated to store the corresponding contents of the memory devices and the requesting core can be notified that the data has been located as soon as the bits from the fastest memory device are stored in the frame. In this manner, access can appear to be as quick as the fastest memory device in the stack. Use of the multiplexed frame structure allows fast first access SRAM data combined with packets of data from DRAM and/or flash to get a continuous stream of data with the lowest possible first access time along with the flexibility to combine packet (page mode) and non-packet data. As used herein, the term "first access time" refers to the read latency of the fastest chip, or memory device, in the stack, that is the chip that delivers data on the bus first compared to other chips in homogeneous or heterogeneous chip configurations.

In accordance with one or more embodiments, thermal dissipation is optimized in a memory stack by having memory devices with the highest power (e.g., SRAM) on the top and bottom of the stack, by having memory devices with intermediate power (e.g., DRAM) next to the SRAM devices, and by having lower power memory devices (e.g., flash) in the middle of the stack.

Turning now to FIG. 1, a block diagram of a system 100 for storing and retrieving data in a memory is generally shown in accordance with one or more embodiments of the invention. The system 100 includes a computer processor 102, a memory 106 having memory devices, and a memory controller 104 for receiving requests from the computer processor 102 to access the memory 106.

As shown in FIG. 1, the memory controller 104 is coupled to the computer processor 102 and can receive write requests from the computer processor 102. The write requests from the computer processor 102 contain data to be written to the memory 106 and a logical address for identifying the location in the memory 106 to which the data will be written. The memory controller 104 stores data at a physical address within the memory 106. In an embodiment, the memory controller 104 maps the logic address to a physical address in the memory 106 when storing the data. The physical address for a given logical address may change each time data in the memory 106 is modified.

Similarly, the memory controller 104 can receive read requests from the computer processor 102. The write requests from the computer processor 102 contain a logical address for identifying the location in the memory 106 from which the data should be read. The memory controller 104 maps the logic address to a physical address in the memory 106 when retrieving the data. The physical address for a given logical address may change each time data in the memory 106 is read.

In accordance with one or more embodiments of the invention, the memory 106 is implemented by one or more memory modules each containing a plurality of memory devices including stacked memory devices. In accordance with one or more embodiments of the invention, the memory devices are stacked on top of each other and connected to each other via one or more through-silicon via (TSV).

The system 100 is one example of a configuration that may be utilized to perform the processing described herein. Although the system 100 has been depicted with only a single memory 106, memory controller 104, and computer processor 102, it will be understood that embodiments can operate in systems with two or more of the memory 106, memory controller 104, and/or computer processor 102. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
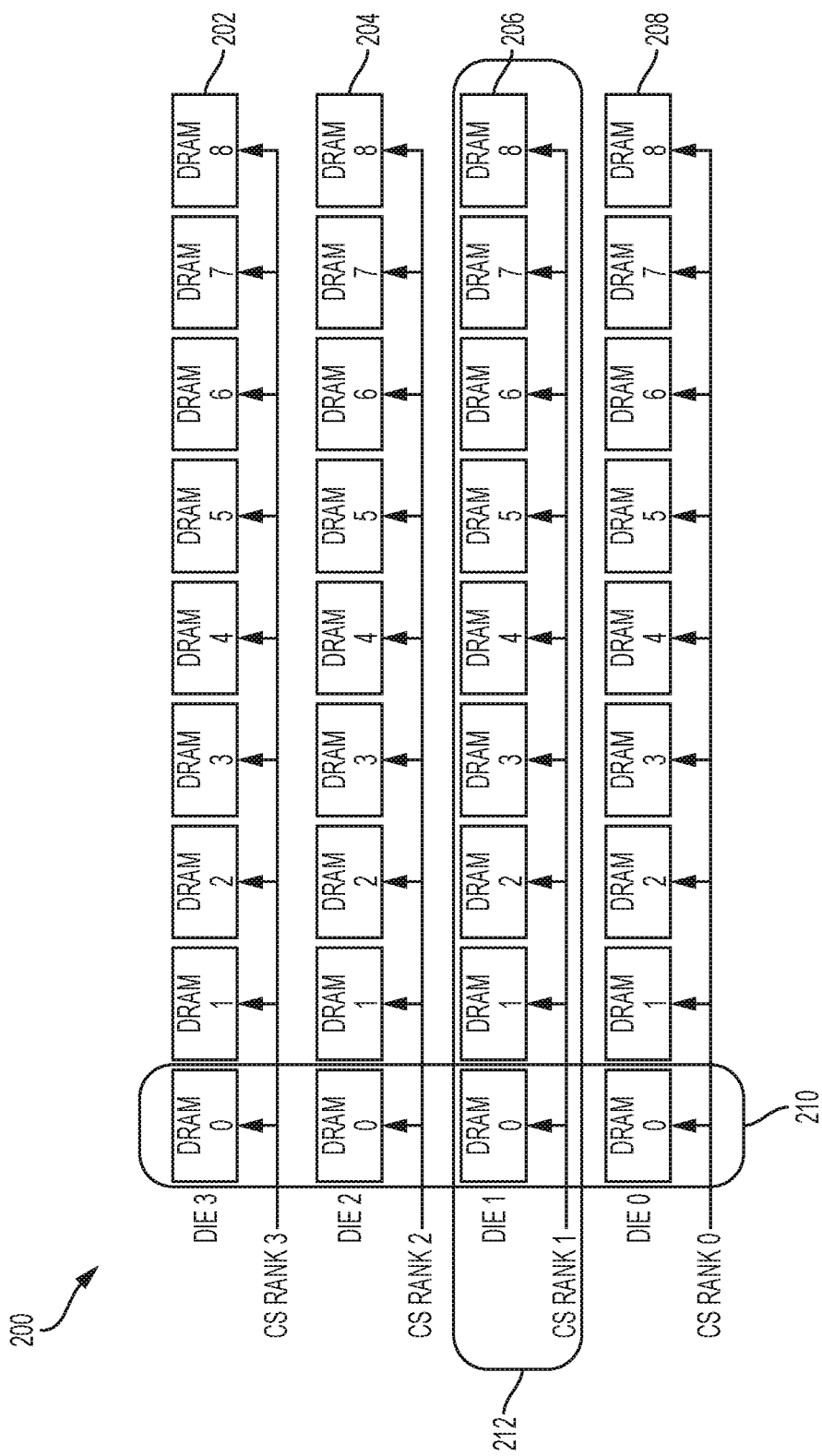
FIG. 2 depicts a block diagram of memory devices in a three-dimensional (3D) memory.

Turning now to FIG. 2, a block diagram 200 of a configuration of a 3D memory that includes stacked memory devices is generally shown. Server systems continue to demand memories that are very high speed with large memory capacities in order to cater to growing capacity requirements. 3D memory architectures can provide higher density integration and therefore will continue to play an important role in future memory systems. 3D packaging of memory can include the stacking of multiple memory dies, or devices, connected through TSV in order to support high memory density in a reduced form factor. As shown in FIG. 2, conventional memory implements a horizontal topology with a ranking scheme that includes a set of DRAM devices connected to the same chip select (CS) switch, and typically all command and control signals are shared within a rank with only the data pins for each DRAM being separate.

Localizing all accesses within a DRAM package by providing vertical ranks that include memory devices in the same stack can have benefits in terms of real estate space, thermal dissipation, and latency. In accordance with one or more embodiments of the invention described herein, vertical ranks are provided by connecting all TSVs from each memory device within a DRAM package, or stack.

Referring to FIG. 2, the memory devices are DRAMS which are stacked (e.g., stack 210) and accessed via CS switches as four ranks, rank 3 202, rank 2 204, rank 1 206, and rank 0 208. The ranks shown in FIG. 2 are defined in a horizontal manner 212, that is, across multiple stacks of the DRAMs. In the configuration shown in FIG. 2, each DRAM stores eight bits and each rank includes nine DRAMs. Each read or write to a rank includes seventy-two bits (eight bits times nine DRAMs) which can include sixty-four data bits and eight error correcting code (ECC) bits. As shown in FIG. 2, each DRAM in stack 210 is associated with a different rank, and thus the memory uses a different CS switch to access each of the DRAMs in the stack 210. As shown in FIG. 2, rank 3 202 corresponds to die 3 (rank 3) and CS switch labeled "CS RANK 3", rank 2 204 corresponds to die 2 (rank 2) and CS switch labeled "CS RANK 2", rank 1 206 corresponds to die 1 (rank 1) and CS switch labeled "CS RANK 1", and rank 0 208 corresponds to die 0 (rank 0) and CS switch labeled "CS RANK 0". Thus, in order to access data from all of the DRAMs in stack 210, four ranks have to be accessed.

Instead of accessing memory devices in a horizontal manner across multiple stacks as shown in FIG. 2, exemplary embodiments of the invention described herein provide a CS switch for accessing all of the memory devices within a stack. In accordance with one or more embodiments of the invention, the DRAMs in each stack, such as stack 210, are accessed with a single CS switch.

Figure 3:
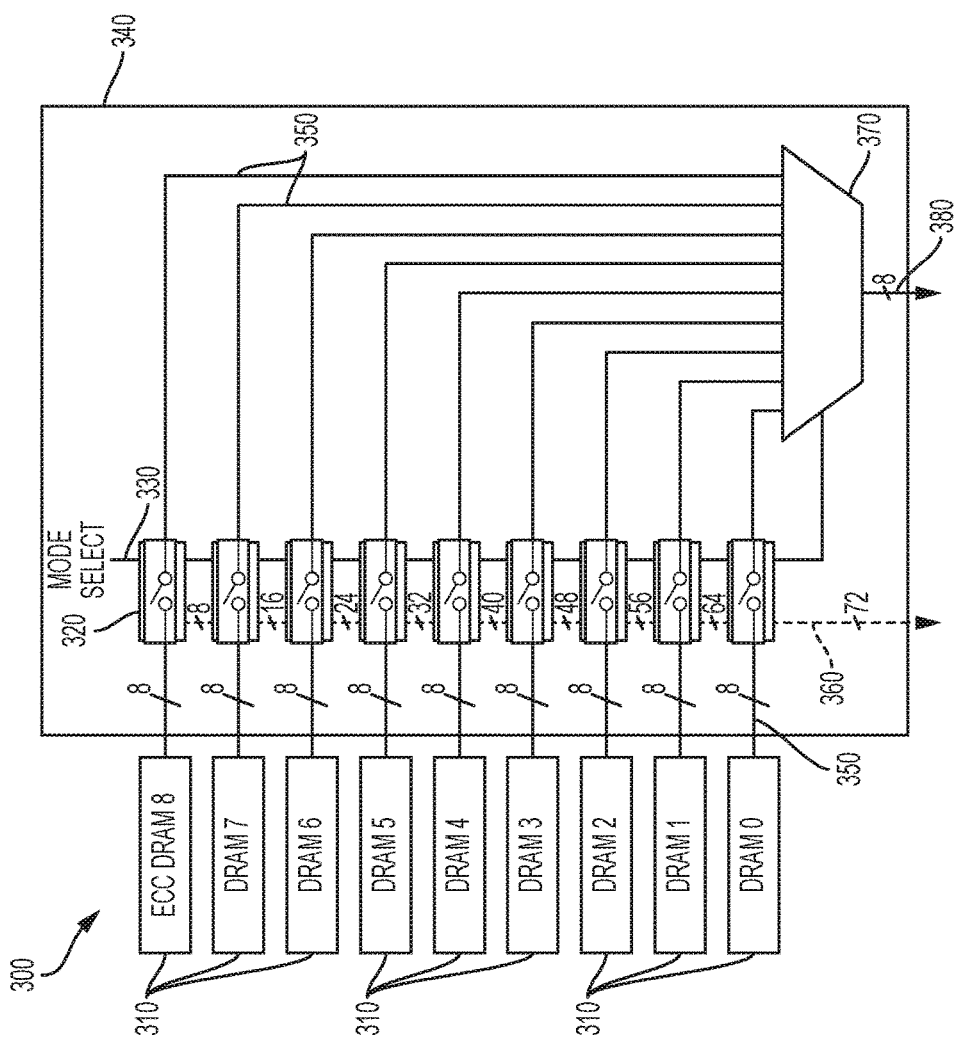
FIG. 3 depicts a block diagram of 3D memory with homogeneous memory devices in accordance with one or more embodiments of the invention.

Turning now to FIG. 3, a block diagram 300 of 3D memory with homogeneous memory devices is generally shown in accordance with one or more embodiments of the invention. The 3D memory shown in FIG. 3 includes a logic chip 340 (e.g., a memory module) with nine DRAMs 310 that are stacked on top of each other and accessible via a CS switch 320 and mode select switch 330. The CS switch 320 includes bus configuration logic to provide bus access to chips (e.g., DRAMS 310) either in a serial or parallel fashion, as configured by mode select switch 330. The DRAMs 310 are connected to each other and to a multiplexer 370 using TSVs 350. As shown in FIG. 3, the DRAMS 310 each store eight bits. In addition, one of the DRAMS 310 stores ECC bits and the other eight DRAMs 310 store data.

The mode select switch 330 is used to configure the memory into a first mode (horizontal) or a second mode (vertical). When the memory is in the first mode, the bits from all of the DRAMs 310 in the stack are input to the multiplexer 370 which selects the bits from one of the DRAMs 310 (e.g., the DRAM 310 specified in the access request) for output (e.g., to a memory controller) via a serial bus 380. Logic chip 340 can direct the multiplexer 370 to choose one of the DRAMs 310. When the memory is in the second mode, the bits from all of the DRAMS 310 in the stack are output (e.g., to a memory controller) in parallel via parallel bus 360. In this manner, a 3D memory with stacked memory devices can dynamically switch, using the mode select switch 330, between accessing one of the memory devices in a stack and accessing all of the memory devices in a stack in parallel.

Figure 4:
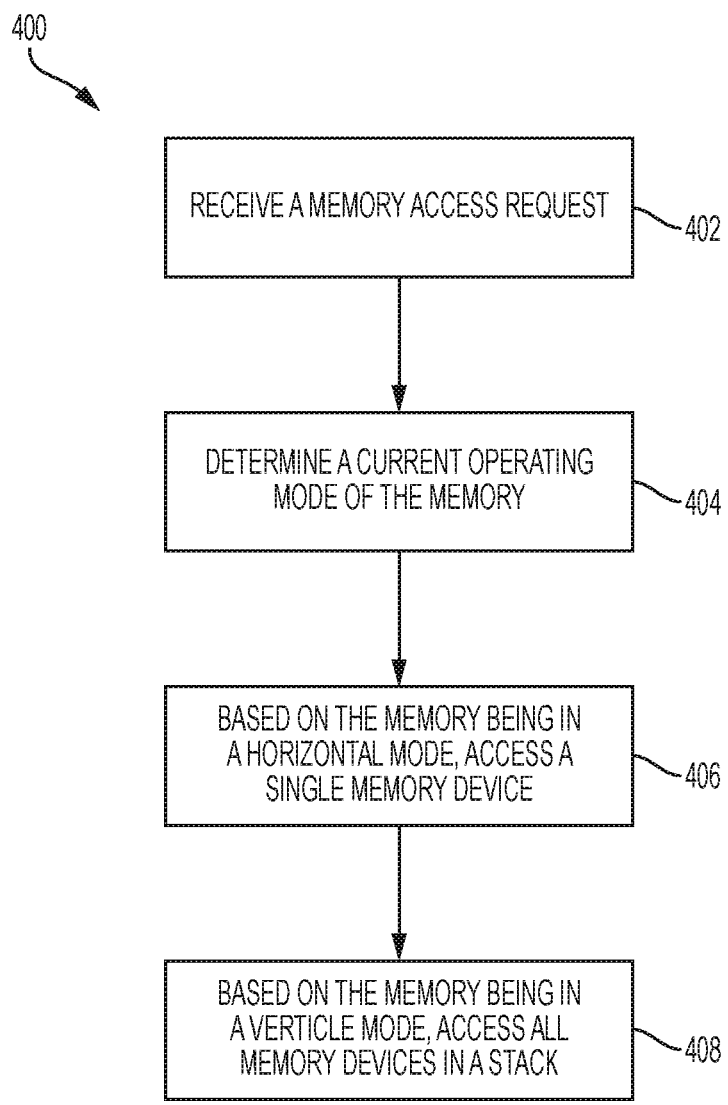
FIG. 4 depicts a flow diagram of a process for accessing homogeneous memory devices in a 3D memory in accordance with one or more embodiments of the invention.

Turning now to FIG. 4, a flow diagram 400 of a process for accessing homogeneous memory devices in a 3D memory is generally shown in accordance with one or more embodiments of the invention. The processing performed in FIG. 4 can be implemented by a memory controller, such as memory controller 104. At block 402 a request to access (e.g., for a read or write operation) one or more memory devices in a stack of memory devices is received. At block 404, a current operating mode of the memory is determined. At block 406, based on the memory being in a first, or horizontal, mode, a chip select signal is activated (using e.g., mode select switch 330 in conjunction with multiplexer 370 and serial bus 380) to provide access to exactly one of the memory devices in the stack of memory devices. The memory access request is serviced by reading data from or writing data to the memory device specified by the request. At block 406, based on the memory being in a second, or vertical, mode, a chip select signal is activated (using e.g., mode select switch 330 in conjunction with multiplexer 370 and parallel bus 360) to provide access to all of the memory devices in the stack of memory devices in parallel. The memory access request is serviced by reading data from or writing data to all of the memory devices in the stack in parallel.

In accordance with one or more embodiments of the invention, different memory types are combined in a single stack of memory devices to optimize for thermal considerations of the stack and to have one memory hierarchy. As used herein, the term "optimized for thermal considerations" refers to identification of the power and thermal characteristics of the individual memory types and stacking them in a such way as to have minimal thermal gradient, in the context of at least one memory type operating at its peak speed, performing either a read or write operation. For example, mixing different memory types in a single stack can be an effective manner of optimizing thermal dissipation based on placement of the different types of memory devices in the stack based on their thermal characteristics (e.g., heat generated by a type memory device during operation). In accordance with one or more embodiments of the invention, accessed data is spread across different memory types to achieve fast first access and later data is spread to slower memory types. Memory types can be combined for one data stream. For example, SRAM and DRAM can operate on the same clock and a single packet data of SRAM can be mixed with continuous paged data from a DRAM. In this example SRAM can use a single clock and be used to access random data (e.g., in a horizontal mode), while the DRAM can be in page mode (e.g., in a vertical mode). In addition, flash devices can operate on the same bus with either clock control or data multiplexing.

Figure 5:
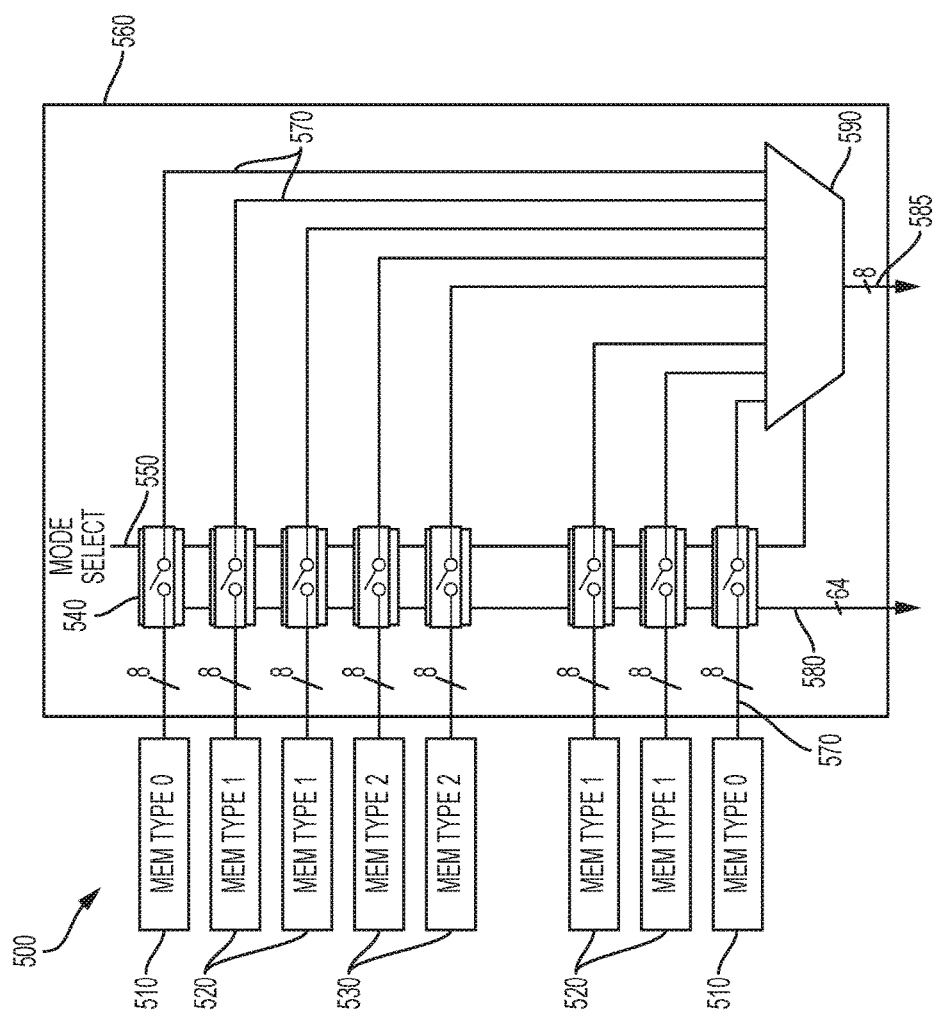
FIG. 5 depicts a block diagram of 3D memory with heterogeneous memory devices in accordance with one or more embodiments of the invention.

Turning now to FIG. 5, a block diagram 500 of 3D memory with heterogeneous memory devices is generally shown in accordance with one or more embodiments. The 3D memory shown in FIG. 5 includes a logic chip 560 with eight memory devices 510 520 530 of different types that are stacked on top of each other and accessible via a CS switch 540 and mode select switch 550. The memory devices 510 520 530 are connected to each other and to a multiplexer 590 using TSVs 570. As shown in FIG. 5, the memory devices 510 520 530 each store eight bits of data.

The mode select switch 550 is used to configure the memory into a first mode (horizontal) or a second mode (vertical). When the memory is in the first mode, the bits from all of the memory devices 510 520 530 in the stack are input to the multiplexer 590 which selects the bits from one of the memory devices 510 520 530 (e.g., a DRAM specified in the access request) for output via a serial bus 585. When the memory is in the second mode, the bits from all of the memory devices 510 520 530 in the stack are output in parallel via parallel bus 580. In this manner, a 3D memory with stacked memory devices can dynamically switch, using the mode select switch 550, between accessing one of the memory devices in a stack and accessing all of the memory devices in a stack in parallel.

As shown in FIG. 5, memory devices 510 are of memory type 0, memory devices 520 are of memory type 1, and memory devices 530 are of memory type 2. Memory type 0, memory type 1, and memory type 2 can refer to any suitable memory device such as, but not limited to SRAM devices, DRAM devices, STT-MRAM devices, and flash memory devices.

In accordance with one or more embodiments of the invention, mode select is built into each stacked memory device and the input/output (I/O) from each memory device is controlled by the mode select switch 550.

Figure 6:
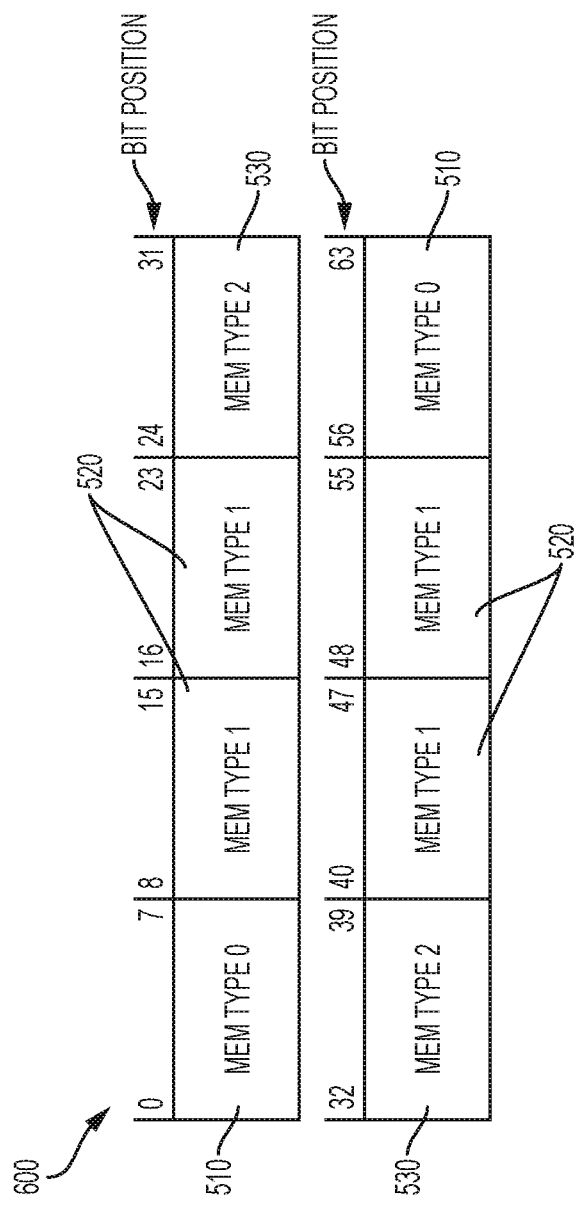
FIG. 6 depicts a block diagram of a multiplexed frame of data from heterogeneous memory devices in a 3D memory in accordance with one or more embodiments of the invention.

Turning now to FIG. 6, a block diagram of multiplexed frame 600 for storing data that is read from heterogeneous memory devices in a 3D memory is generally shown in accordance with one or more embodiments of the invention. In accordance with one or more embodiments of the invention the multiplexed frame 600 is located in a memory controller, such as memory controller 104. Different types of memory are associated with different access speeds. For example, flash memory devices generally have slower access speeds than DRAM devices which generally have slower access speeds than SRAM devices. In accordance with one or more embodiments of the invention, these differences in access speed are taken into account by using a multiplexed frame 600, such as the one shown in FIG. 6.

In accordance with one or more embodiments of the invention, when a read access is being serviced and the memory is in the vertical mode where all of the memory devices in a stack are accessed in parallel, the data read from each of the memory devices is output to the multiplexed frame 600 as soon as it is received from a memory devices. The memory controller can notify a core that a read access is being serviced (e.g., that at least a portion of the data to be read has been returned. Once the core is notified it can opportunistically start the code execution based on the available data from fast memory, provided that the data is consumable in its current form. This can result in reducing the number of stall cycles by operating on early available data. The memory controller can perform an ECC operation on the data in the multiplexed frame 600 once data has been received from all of the memory devices in the stack and send the data to the requesting core, or processor.

In accordance with one or more embodiments of the invention, at least one of the memory devices in the stack (e.g., a DRAM device) generates packet data and at least one of the other memory devices in the stack (e.g., a SRAM device) generates non-packet data. The packet data and the non-packet data can be combined by the memory controller in the multiplexed frame 600.

In accordance with one or more embodiments of the invention, a structure that uses stacked memory of either the same or different memory types that optimizes first access time is provided. In addition, the memory types can be placed to optimize thermal dissipation in the stack with the hottest memory types on the top and bottom of the stack. Further, first access SRAM data can be combined with DRAM packet data and/or flash data to provide a continuous stream of data with the lowest possible first access time.

Technical effects and benefits of embodiments of the present invention include the ability to optimize thermal dissipation in a stack of memory devices by using different types of memory devices in a stack and placing the memory devices that generate the most heat on the top and the bottom of the stack. Embodiments of the present invention also include the ability to dynamically switch between a horizontal access mode and a vertical access mode depending on application requirements. In addition a continuous stream of data with a minimized first access time is provided along with the ability to combine packet and non-packet data.

The terminology used herein is for the purpose of describing particular embodiments of the invention only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments of the invention were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   receiving a request at a memory controller to access one or more memory devices in a stack of memory devices in a physical memory, each of the memory devices communicatively coupled to the memory controller and to at least one other of the memory devices in the stack via a through silicon via (TSV); and
   in response to receiving the request:
      determining a current operating mode of the physical memory based at least in part on a value of a mode select switch;
      based at least in part on the current operating mode of the physical memory being a first mode, activating a chip select switch to provide access to exactly one of the memory devices in the stack of memory devices;
      based at least in part on the current operating mode of the physical memory being a second mode, activating the chip select switch to access all of the memory devices in the stack in parallel; and
      servicing the request using the activated chip select switch,
      wherein based at least in part on the current operating mode of the physical memory being the second mode and the access being a read access, servicing the request includes outputting read data as it is received from each of the memory devices in the stack of memory devices to a multiplexed frame located on the memory controller, wherein the memory controller performs an error correcting code (ECC) operation on the multiplexed frame in response to the multiplexed frame receiving data from all of the memory devices in the stack.

2. The method of claim 1, wherein the request includes a requested operating mode of the physical memory and the method further comprises, based at least in part on the current operating mode of the physical memory not matching the requested operating mode of the physical memory, changing the current operating mode of the physical memory to the requested operating mode of the physical memory.

3. The method of claim 1, wherein the memory devices are homogeneous.

4. The method of claim 1, wherein the memory devices are heterogeneous and the memory controller accounts for timing differences between the memory devices.

5. The method of claim 4, wherein the memory devices are in the stack in an order that is based at least in part on a thermal characteristic of at least one of the memory devices in the stack.

6. The method of claim 4, wherein at least one of the memory devices in the stack generates packet data, at least one of the other memory devices in the stack generates non-packet data, and the packet data and the non-packet data are combined by the memory controller into the multiplexed frame when the current operating mode of the physical memory is the second mode.

7. The method of claim 1, wherein the memory controller notifies a processor that the read data has been located based at least in part on receiving data in the multiplexed frame from at least one of the memory devices in the stack of memory devices.

8. A system comprising:
   a memory controller comprising one or more processors for executing non-transitory computer readable instructions, the computer readable instructions controlling the one or more processors to perform operations comprising:
   receiving a request to access one or more memory devices in a stack of memory devices in a physical memory, each of the memory devices communicatively coupled to at least one other of the memory devices in the stack via a through silicon via (TSV); and
   in response to receiving the request:
      determining a current operating mode of the physical memory based at least in part on a value of a mode select switch;
      based at least in part on the current operating mode of the physical memory being a first mode, activating a chip select switch to provide access to exactly one of the memory devices in the stack of memory devices;

based at least in part on the current operating mode of the physical memory being a second mode, activating the chip select switch to access all of the memory devices in the stack in parallel; and servicing the request using the activated chip select switch, wherein based at least in part on the current operating mode of the physical memory being the second mode and the access being a read access, servicing the request includes outputting read data as it is received from each of the memory devices in the stack of memory devices to a multiplexed frame located on the memory controller, wherein the memory controller performs an error correcting code (ECC) operation on the multiplexed frame in response to the multiplexed frame receiving data from all of the memory devices in the stack.

9. The system of claim 8, wherein the request includes a requested operating mode of the physical memory and the method further comprises, based at least in part on the current operating mode of the physical memory not matching the requested operating mode of the second memory, changing the current operating mode of the physical memory to the requested operating mode of the physical memory.

10. The system of claim 8, wherein the memory devices are homogeneous.

11. The system of claim 8, wherein the memory devices are heterogeneous and the memory controller accounts for timing differences between the memory devices.

12. The system of claim 11, wherein the memory devices are in the stack in an order that is based at least in part on a thermal characteristic of at least one of the memory devices in the stack.

13. The system of claim 11, wherein at least one of the memory devices in the stack generates packet data, at least one of the other memory devices in the stack generates non-packet data, and the packet data and the non-packet data are combined by the memory controller into the multiplexed frame when the current operating mode of the physical memory is the second mode.

14. The system of claim 8, wherein the memory controller notifies a processor that the read data has been located based at least in part on receiving data in the multiplexed frame from at least one of the memory devices in the stack of memory devices.

15. A computer program product comprising a non-transitory computer readable storage medium having program instructions embodied therewith, the program instructions executable by a processor to cause the processor to perform operations comprising:

receiving a request to access one or more memory devices in a stack of memory devices in a physical memory, each of the memory devices communicatively coupled to at least one other of the memory devices in the stack via a through silicon via (TSV); and in response to receiving the request:
    determining a current operating mode of the physical memory based at least in part on a value of a mode select switch;
    based at least in part on the current operating mode of the physical memory being a first mode, activating a chip select switch to provide access to exactly one of the memory devices in the stack of memory devices;
    based at least in part on the current operating mode of the physical memory being a second mode, activating the chip select switch to access all of the memory devices in the stack in parallel; and
    servicing the request using the activated chip select switch,
    wherein based at least in part on the current operating mode of the physical memory being the second mode and the access being a read access, servicing the request includes outputting read data as it is received from each of the memory devices in the stack of memory devices to a multiplexed frame located on a memory controller, wherein the memory controller performs an error correcting code (ECC) operation on the multiplexed frame in response to the multiplexed frame receiving data from all of the memory devices in the stack.

16. The computer program product of claim 15, wherein the request includes a requested operating mode of the physical memory and the method further comprises, based at least in part on the current operating mode of the physical memory not matching the requested operating mode of the physical memory, changing the current operating mode of the physical memory to the requested operating mode of the physical memory.

17. The computer program product of claim 15, wherein the memory devices are heterogeneous and the memory controller accounts for timing differences between the memory devices, at least one of the memory devices in the stack generates packet data, at least one of the other memory devices in the stack generates non-packet data, and the packet data and the non-packet data are combined by the memory controller into a multiplexed frame when the current operating mode of the physical memory is the second mode.

* * * * *